Jan. 18, 1966 G. R. HYKES 3,230,399
FREQUENCY DIVIDER
Filed June 3, 1964 2 Sheets-Sheet 1

INVENTOR.
GLENN R. HYKES
BY Moody and Phillion
ATTORNEYS

Jan. 18, 1966 G. R. HYKES 3,230,399

FREQUENCY DIVIDER

Filed June 3, 1964 2 Sheets-Sheet 2

INVENTOR.
GLENN R. HYKES

BY Moody and Phillion
ATTORNEYS

United States Patent Office 3,230,399
Patented Jan. 18, 1966

3,230,399
FREQUENCY DIVIDER

Glenn R. Hykes, Cedar Rapids, Iowa, assignor to Collins Radio Company, Cedar Rapids, Iowa, a corporation of Iowa Filed June 3, 1964, Ser. No. 372,172
7 Claims. (Cl. 307—88.5)

This invention relates generally to frequency dividers and more specifically to frequency dividers capable of dividing frequencies by a factor of up to 50 and utilizing the avalanche characteristics of transistors.

There exist prior art frequency dividers using transistors and capable of dividing frequencies by factors of 4 or 5. One type prior art frequency dividers, known as a locked oscillator divider, comprises an oscillator running at the lower frequency which is phase locked by the higher frequency to be divided. Such type frequency divider employs an oscillatory circuit such as a tank circuit and a driving circuit, which can comprise a transistor, the output of which feeds into the tank circuit. For this type divider to operate properly the actual pulses generated by the transistor, which pulses might be identified also as composite transistor current pulses, must be about the same width as a half cycle of the higher synchronizing frequency. When such condition is met, the said composite transistor current pulses are resultants of the oscillator current and the higher frequency synchronizing driving pulses. The higher frequency synchronizing driving pulses function to control the relative phase of the composite transistor current pulses which are fed into the tank circuit, and thereby also functions to control the tank circuit signal frequency and phase.

Using the linear portion of transistor curves, it is difficult to generate short enough pulses in a single divider to reliably synchronize in 10 to 1, or higher, ratios. More specifically, with ratios of 10 or more to 1, the energy deliverable by a transistor during a half cycle of the synchronizing signal, over the linear portion of the transistor curves, is insufficient to exercise control over the phase of the tank circuit signal.

An object of the present invention is to provide a frequency divider using a transistor in which frequency division of the order of 50:1 is obtainable.

A second purpose of the invention is to provide a frequency divider employing the operation of a transistor in the avalanche region thereof.

A third aim of the invention is the improvement of frequency dividers generally.

In accordance with the invention, there is provided a transistor with an inductive impedance connecting the collector voltage supply to the transistor collector. The transistor emitter is connected to the other terminal of the voltage source through a second resistor which is shunted by capacitor means.

Voltage divider means is connected across the voltage source with a tap thereon connected to the base of the transistor and is designed so that the transistor is operating in a steady state condition just at the threshold of the avalanche region. Means are provided to supply an input signal having a given frequency $f_1$, which is to be divided by some predetermined factor by the divider circuit. A second capacitor means is connected across the collector-emitter electrodes of the transistor and functions to accumulate a charge through the collector load impedance from the said voltage source and functions, when charged to a predetermined potential, to cause the transistor to move well into the avalanche operating region, thus effectively causing said transistor to be a short circuit around said second capacitor means.

In accordance with a feature of the invention, the said second capacitor will, upon breakdown of the transistor, discharge very rapidly through said transistor and will cause said transistor to almost immediately resume operation in the normal operating range. The capacitor will then begin to charge again through the collector impedance until it reaches the potential necessary to cause breakdown of the transistor. The selection of the values of the various components determines the time interval between breakdown occurrences of the transistor, and thus determines the frequency division effected by the circuit. Due to the very rapid discharge of the capacitor, phase lock of the divided frequency with the input frequency can be effected within a relatively narrow half cycle of an input signal so that a high ratio of frequency division is possible.

In accordance with another feature of the invention, breakdown of the transistor will always occur during a half cycle of the particular polarity of the input signal, depending upon the type transistor used. For example, an NPN type transistor will break down during the positive half cycle of the received signal. Since a negative half cycle of the input signal occurs on both sides of each positive half cycle, the breakdown of the transistor occurs only at discrete time intervals determined by the occurrence of one of the positive half cycles of the input signal. Obviously, there can be some tolerance in charge time with breakdown of the transistor still occurring on every $n$th positive half cycle of the input signal.

The above-mentioned and other objects and features of the invention will be more fully understood from the following detailed description thereof, when read in conjunction with the drawings, in which.

Figure 1:
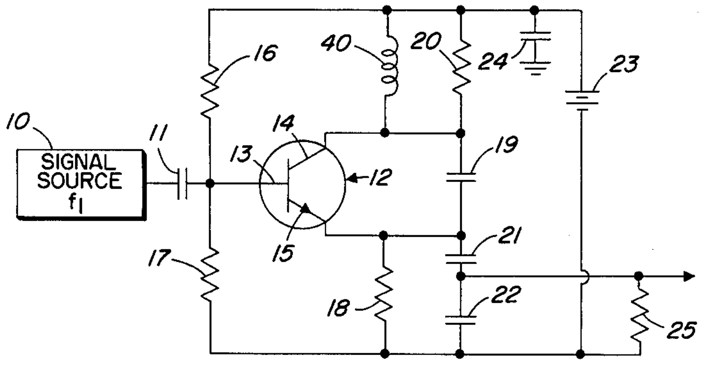
FIG. 1 is a schematic diagram of the invention.

Referring now to FIG. 1, there is shown a signal source 10 of a frequency $f_1$, which frequency is to be divided by the circuit of FIG. 1. The signal from source 10 is supplied to the base 13 of transistor 12 through coupling capacitor 11. Biasing for the base electrode 13 is provided by means of battery source 23 and a voltage divider consisting of resistors 16 and 17, which function to cause transistor 12 to operate in a steady state value at the threshold of the avalanche region, which will be discussed in more detail later herein. For the present, it should be noted that the steady state operating point of the transistor 12 could be point 27 in FIG. 2, which point is located on load line 28, with the area between the dotted lines 30 and 31 representing the avalanche region of the transistor.

The collector 14 of the transistor is connected to the positive terminal of battery source 23 through resistor 20 and inductor 40. Emitter 15 of transistor 12 is connected to ground through resistor 18. Inductor 40 and resistors 20 and 18 provide the D.-C. collector current path for transistor 12. Shunted around the emitter resistor 18 are capacitance means comprised, in the specific circuit of FIG. 1, of capacitors 21 and 22 which provide an A.-C. path for the collector-emitter current of the transistor 12, as will be discussed later herein.

Across the collector-emitter electrodes is connected capacitor 19 which becomes charged by current flow through resistor 20 and inductor 40 until the collector voltage of transistor 12 becomes sufficiently positive to cause transistor 12 to operate in the avalanche region. At this time the transistor 12 will, for all practical purposes, break down to permit the capacitor 19 to discharge therethrough. In order to isolate high frequency components from the D.-C. power supply 23, there is provided an R.-F. by-pass capacitor 24.

The output of the circuit can be taken across the capacitor 22, for example, or across the series combination of capacitors 21 and 22, depending upon the magnitude of the signal desired. The resistor 25 represents a utilization load resistor in the output circuit.

Figure 2:
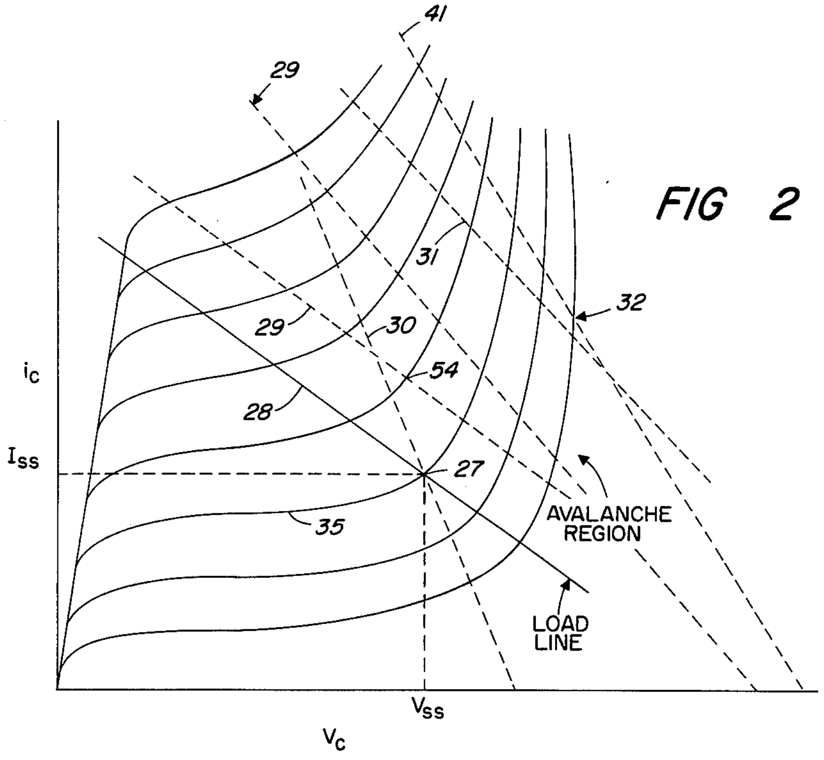
FIG. 2 is a family of characteristic curves of a transistor.

Before going into a detailed discussion of the operation of the circuit of FIG. 1, reference will be made to the circuit of FIG. 2 which shows the operating characteristics of a transistor such as the transistor 12 of FIG. 1; said transistor 12 being of the type 29709. The normal operating range of transistor 12 lies to the left and below the dotted line 30, in which area there is shown a family of curves representing the collector current and collector voltage characteristics of the transistor with various base current values. Between the dotted lines 30 and 31, there is shown what is generally known as the avalanche region of the transistor. In this avalanche region the transistor, in essence, breaks down and becomes a virtual short circuit so that for very small changes in voltage thereacross there is produced extremely large variations in collector current, as can be seen from the curves of FIG. 2. If a transistor is operating on a load line 28 which, of course, is established by the load resistance of the collector circuit as well as the collector voltage, the steady state operating point can be determined by regulating the base current. For example, the point 27 can be selected as a steady state operating condition of the transistor 12 simply by biasing the base electrode such that the base current has the value represented by the curve characteristic 35. It can be seen from the curves of FIG. 5 that the operating point 27 is at the threshold of the avalanche region and that either an increase in base current or an increase in collector voltage will function to move the operation of the transistor into the avalanche region. In the present invention the collector voltage is steadily increasing due to the charging of capacitor 19 in FIG. 1 and, also, the base current is increased during each positive half cycle of the signal supplied thereto from signal source 10 so that a point is reached when the load line is effectively moved over to the right towards the dotted line 29. The transistor is then actually operating in the avalanche region and breaks down so that a slight additional increase in the charge across the capacitor 19 (with the resultant increase in collector voltage) will produce very large currents through the transistor 12.

Referring now to FIG. 1, there will first be discussed the operating conditions that would exist in absence of the capacitor 19, in order to obtain a background for understanding the effects of capacitor 19, resistor 20, and inductor 40. In the absence of capacitor 19, the transistor 12 would operate at steady state near the threshold of the avalanche region as, for example, at point 27. Under such circumstances as the input signal is supplied to the base 11, the operation of the transistor will be along the load line 28 which lies in the normal operating range, although just at the threshold of the avalanche region.

However, if by some means, the collector voltage can be increased, the load line will be shifted to the right, as indicated by load lines 29 and 41, and the collector current will become much greater, finally approaching a condition of a short circuit through the transistor 12.

Figure 4:
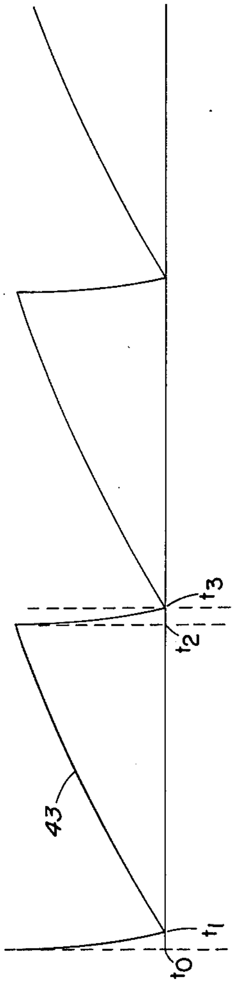
FIG. 4 is a waveform of the collector voltage of the transistor over a few cycles of operation.

Such increase in collector voltage is accomplished through the use of the capacitor 19, the resistor 20, and the inductor 40. Assume the condition where the transistor 12 has just broken down, as represented by time $t_0$ of the waveform of FIG. 4, which waveform represents the collector voltage of transistor 12. At time $t_0$ the charge accumulated on the capacitor 19 discharges through transistor 12 so that the collector-emitter impedance of transistor 12 is almost zero, and the potential of the collector also drops to almost zero at time $t_1$ in FIG. 4. At this time $t_1$ the transistor 12 becomes nonconductive since there is no voltage across the collector-emitter electrodes. The charging of capacitor 19 will then commence again through resistor 20 and inductor 40 from battery source 23. Due to the resonant circuit comprised of inductor 40 and capacitor 19, the capacitor 19 will tend to charge to a higher voltage than that supplied by battery 23. The charging of the capacitor 19 is represented by the rising of waveform 43 of FIG. 4 and will continue until time $t_2$. At time $t_2$ the collector-emitter voltage of the transistor, aided by the positive half cycle 44 supplied to the base thereof, combine to cause the transistor to again move into the avalanche region of operation and, in effect, become a short circuit discharge path for the charge on capacitor 19. Actually, the load line for the transistor 12 during this period of breakdown is an indeterminate characteristic and cannot be shown with accuracy upon the curve of FIG. 2. Such load line could be the load line 29 or 41 of FIG. 2 or, more likely, a rapidly shifting load line.

Figure 5:
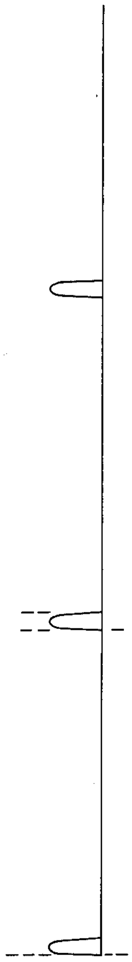
FIG. 5 is a waveform showing the current discharge through the transistor during the periods of breakdown.

During such breakdown period there is, of course, a large current flow through the transistor 12, as represented generally by the pulses of FIG. 5.

Figure 6:
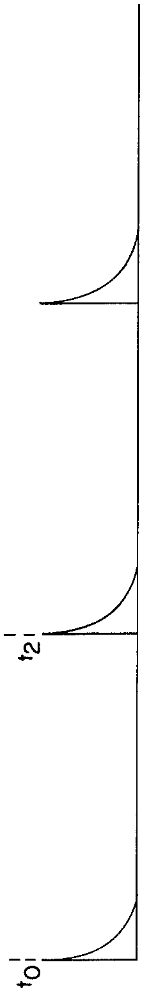
FIG. 6 is a waveform showing the pulses occurring at the emitter electrode of the transistor as a result of the breakdown thereof.

Due to the finite time necessary to discharge the capacitor 19 and, further, due to the fact that the capacitor 19 is much smaller in value than capacitors 21 and 22, the collector electrode potential existing immediately before breakdown will momentarily appear on the emitter immediately after breakdown, as indicated at time $t_0$ and $t_2$ of the waveforms of FIG. 6, which shows the emitter voltage. Such positive pulses appear across capacitors 21 and 22 and provide a suitable point for extracting a usable output signal from the circuit.

Figure 3:
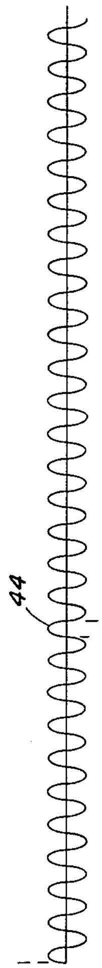
FIG. 3 is a waveform showing the input signal whose frequency is to be divided by the circuit.

Returning again to the function of the capacitor 19, the inductor 40, and the resistor 20, it is to be noted that the resonant frequency of inductor 40 and capacitor 19 (plus capacitors 21, 22, and 24) must be such that a charging rate for capacitor 19 follows the waveform shown in FIG. 3. If the resonant frequency of the resonant circuit comprising inductor 40 and capacitors 19, 21, 22, and 24 were greater than one-fourth the time $t_1$–$t_2$, then the circuit would be inoperable since the voltage across capacitor 19 would have risen to a peak and would have begun to fall in the time interval $t_1$–$t_2$. It can be seen from FIG. 3 that the voltage across capacitor 19 must be continuously rising between times $t_1$ and $t_2$ in order for the circuit to be effective.

The current components that make up the charging current for capacitor 19 include the current through the inductor 40 and also the current through the resistor 20. A detailed analysis of these two current components is not considered necessary to this description, since it is a matter of design, and since many different combinations of component values will accomplish the desired result. It should be noted, however, that the resonant frequency of the resonant circuit, including inductor 40 and capacitors 19, 21, 22, and 24, preferably should be something of the order of one-sixth, or less, of the frequency corresponding to the period $t_1$–$t_2$.

As an alternative method of operation of the structure of FIG. 1, the base electrode 13 is biased into the avalanche region in the absence of the effect of the capacitor 19. Thus, for example, the base electrode 13 is biased so the operating point of the transistor 12, in the absence of the capacitor 19, operates at, or near, the point 54. However, such operating point is unstable, since it is in the avalanche region, and reliable operation is not obtainable. However, with the effect of the capacitor 19, the operation of the transistor 12 moves into and out of the avalanche region as the capacitor 19 charges and discharges. More specifically, when the capacitor 19 discharges through transistor 12, the said transistor 12 will become substantially nonconductive and move into the stable area of operation. Then capacitor 19 recharges through inductor 40 and resistor 20, and when the charge on capacitor 19 becomes sufficiently large, transistor 12 will enter the avalanche area of operation and will provide a virtual short circuit discharge path for said capaictor 19. With such an arrangement it is not necessary that inductor 40 be part of the circuit, since the entering of transistor 12 into the avalanche area is not dependent upon a resonant circuit action to charge capacitor 19, but rather depends upon a simple charging of the capacitor 19 through a resistor, such as resistor 20.

It is to be noted that the forms of the invention shown and described herein are but preferred embodiments thereof, and that various changes may be made therein without departing from the spirit or scope of the invention.

I claim:

1. Frequency divider means comprising:

electron valve means having a breakdown region of operation and comprising an electron emitting electrode, an electrode collecting electrode, and an electron control electrode, D.-C. voltage means, inductive impedance means connecting a first terminal of said D.-C. voltage means to said electron collecting electrode, second impedance means connecting the said electron emitting electrode to the second terminal of said D.-C. voltage means, first capacitive impedance means connected across said electron emitting-electron collecting electrodes, biasing means for biasing said electron valve means to the threshold of its breakdown region of operation, said capacitive impedance means constructed to charge through said first inductive impedance means to cause breakdown of said electron valve means and to discharge through said electron valve means in its breakdown condition.

2. Frequency divider means in accordance with claim 1 in which said second impedance means comprises second capacitive impedance means, said first capacitive impedance means, said second capacitive impedance means and said inductive impedance means forming a resonant circuit means with a resonant frequency determinative of the rate of charge of said first capacitive impedance means and the frequency of breakdown of said electron valve means.

3. Frequency divider means in accordance with claim 2 in which said electron valve means comprises a transistor.

4. Frequency divider means comprising:

transistor means having an avalanche region of operation and comprising collector means, emitter means, and base means, D.-C. voltage means, inductive impedance means connecting a first terminal of said D.-C. voltage means to said collector means, second impedance means connecting the second terminal of said D.-C. voltage means to said emitter means, biasing means for biasing said base means near the threshold of the avalanche region of operation of the transistor means, first capacitive impedance means connected across the collector-emitter means of said transistor means, said inductive impedance means, said second impedance means, and said first capacitive impedance means constructed to have a natural resonant frequency to cause the charge accumulated by said first capacitive means to initiate repetitive avalanche region operation of said transistor means at a frequency equal to $f_i/N$ where $f_i$ is the frequency of the input signal to the frequency divider means and N is the division factor.

5. Frequency divider means in accordance with claim 4 in which said second impedance means comprises second capacitive impedance means.

6. Frequency dividing means comprising:

electron valve means having a breakdown area of operation and comprising an electron emitting electrode, an electron collecting electrode, and an electron control electrode, D.-C. voltage source means, inductive impedance means connecting said electron collector electrode to a first terminal of said D.-C. voltage source means, first capacitive means connecting said electron emitting electrode to the second terminal of said D.-C. voltage source means, second capacitive means connected across said electron collector-electron emitter electrodes, and biasing means for biasing said electron valve into the threshold of its breakdown area of operation, said first capacitive means, said second capacitive means, and said inductive impedance means forming a resonant circuit with a resonant frequency determining the rate of charge of said second capacitive impedance means and the frequency of breakdown of said electron valve means.

7. Frequency divider means in accordance with claim 6 in which said electron valve means comprises a transistor.

References Cited by the Examiner

UNITED STATES PATENTS

| | | | |
|---|---|---|---|
| 2,665,379 | 1/1954 | Hadden | 328—30 X |
| 3,163,779 | 12/1964 | Leightner | 307—88.5 |
| 3,179,812 | 4/1965 | Schrecongost | 307—88.5 |

FOREIGN PATENTS

| | | |
|---|---|---|
| 814,185 | 6/1959 | Great Britain. |

JOHN W. HUCKERT, *Primary Examiner.*

S. D. MILLER, *Assistant Examiner.*

UNITED STATES PATENT OFFICE
CERTIFICATE OF CORRECTION

Patent No. 3,230,399 January 18, 1966

Glenn R. Hykes

It is hereby certified that error appears in the above numbered patent requiring correction and that the said Letters Patent should read as corrected below.

Column 5, line 22, for "electrode", first occurrence, read -- electron --.

Signed and sealed this 3rd day of January 1967.

(SEAL)
Attest:

ERNEST W. SWIDER
Attesting Officer

EDWARD J. BRENNER
Commissioner of Patents